(12) United States Patent
Grunzke (10) Patent No.: US 7,558,130 B2
(45) Date of Patent: Jul. 7, 2009

(54) ADJUSTABLE DRIVE STRENGTH APPARATUS, SYSTEMS, AND METHODS

(75) Inventor: Terry M. Grunzke, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/757,834

(22) Filed: Jun. 4, 2007

(65) Prior Publication Data

US 2008/0297199 A1 Dec. 4, 2008

(51) Int. Cl.
*G11C 7/00* (2006.01)
(52) U.S. Cl. .................. 365/191; 365/227; 365/230.03
(58) Field of Classification Search ................. 365/191, 365/200, 230.03; 326/30, 86; 327/108
See application file for complete search history.

(56) References Cited

U.S. PATENT DOCUMENTS

| | | | |
|---|---|---|---|
| 5,822,256 A * | 10/1998 | Bauer et al. .................. 365/200 |
| 6,208,168 B1 * | 3/2001 | Rhee ............................ 326/83 |
| 7,173,865 B1 * | 2/2007 | Ansel et al. .................. 365/191 |
| 2001/0000949 A1 * | 5/2001 | Rhee ............................ 326/85 |
| 2006/0044008 A1 | 3/2006 | Miyake et al. |
| 2007/0165461 A1 * | 7/2007 | Cornwell et al. ....... 365/185.33 |
| 2007/0279988 A1 * | 12/2007 | Nguyen ................. 365/185.18 |

OTHER PUBLICATIONS

"Open NAND Flash Interface Specification", *ONFi*, Revision 1.0,(Dec. 28, 2006), 1-102.

* cited by examiner

*Primary Examiner*—Vibol Tan
(74) *Attorney, Agent, or Firm*—Schwegman, Lundberg & Woessner, P.A.

(57) ABSTRACT

Apparatus, methods, and systems are disclosed, such as those involving a multi-die device having a common bus to indicate a state of each of a die of a multi-die device and that provides the state of all of the dice at a common output. Such a multi-die device can comprise two or more dice in a multi-die package, wherein each of said dice has a first drive parameter when indicating a first state and a second drive parameter when indicating a second state. When the first drive parameter of the two or more dice is at a value such that when one or more of said two or more dice is in the first state, said common output can indicate that all of the dice in the multi-die device are in the first state.

35 Claims, 5 Drawing Sheets

ADJUSTABLE DRIVE STRENGTH APPARATUS, SYSTEMS, AND METHODS

TECHNICAL FIELD

The present disclosure relates to the field of multiple die devices and data outputs for those multiple die devices on a shared output bus.

BACKGROUND

Non-volatile memory devices, such as flash memory devices, are used to store data and other kinds of information. Many computers and electronic devices, for example, digital audio players, digital cameras, digital recorders, and cellular phones, have flash memory devices. Flash memory devices may also be used as portable storage devices, such as portable Universal Serial Bus (USB) flash drives or "thumb" drives. Flash memory devices may not need power to maintain the information stored in the device.

NAND Flash memories are made up of multi-die (e.g. multi-lun) packages. These devices are often referred to as multi-lun flash memories. A multi-lun device has multiple logic units in a package that may share a common bus. These devices are often developed to be compliant with a common interface specification for an industry. For example one such specification is the ONFi (Open NAND Flash Interface) specification, developed to simplify integration of NAND Flash memory into consumer electronics devices, computing platforms and industrial systems. For more information regarding the ONFi specification, the reader is encouraged to consult the document "Open NAND Flash Interface Specification," Revision 1.0, published by the ONFi Workgroup in 2006, and later versions.

The ONFi specification provides two ways to inquire as to the status of the multi-die package: a Read Status (70h) command that reads the status of all of the dice in a package, and a Read Status Enhanced (78h) command that reads each of the dice individually. In response, the dice provide their output to common bus.

There are potential drawbacks with the use of each command. For example, in a multi-die package, the Read Status Enhanced command operates so that the status of each die is read separately, taking a minimum of one command per die. On the other hand, using a Read Status command may cause unpredictable outputs on the bus if the data output from more than one die in a package is different from the output from the rest of the dice.

Consider a four die package that has received a Read Status command. In this case, all of the devices will transmit their status, and if one device is active and the other three devices are inactive, the output to the common bus will be unpredictable. This is defined as bus contention on the line. Specifically, the output may indicate that the package is inactive or ready to receive data in this situation. As a result the electronic system coupled to the package may try to write to the package before all of the dice are ready to receive data, which may cause the loss of data. Alternatively, as result of an inactive device indication, the system may run a Read Status Enhanced command to determine that all of the individual dice have actually been written, using several additional commands to determine the true status of the multi-die package.

Therefore, there is a need for, among other things, methods, apparatus and systems to improve the management of bus contention on common outputs in these devices.

DETAILED DESCRIPTION

Figure 1:
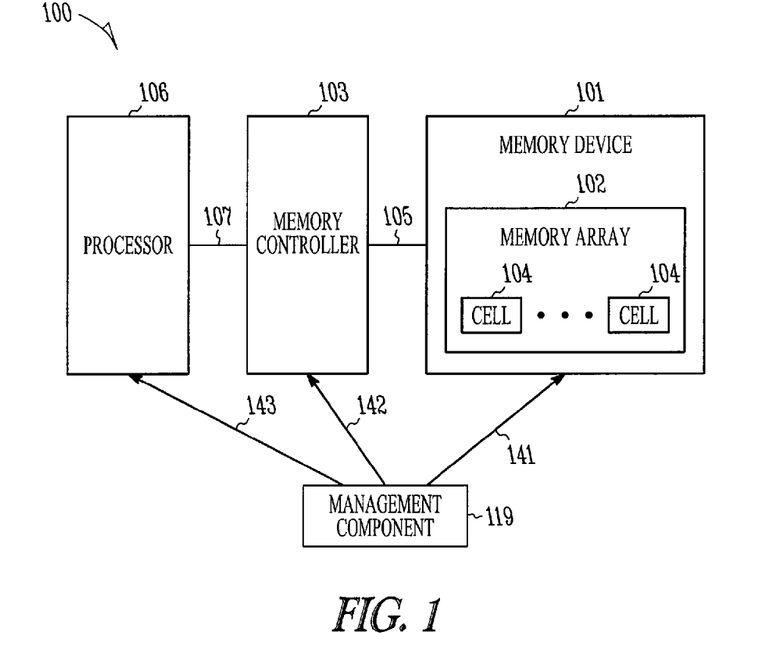
FIG. 1 shows a block diagram of a system according to an embodiment of the invention.

FIG. 1 shows a block diagram of a system 100 according to an embodiment of the invention. System 100 may reside in an electronic system such as a computer, a cellular phone, a Universal Serial Bus (USB) flash drive or a digital camera. As shown in FIG. 1, system 100 may include a memory device 101 having a memory array 102 with cells 104 made up of multi-die packages to store information such as data from a user and control data generated by system 100. System 100 may also include a memory controller 103 to control communication between memory device 101 and a processor 106 via one or more interfaces or bus 105 and bus 107.

System 100 may further include a management component 119, which may participate in the management of information in system 100, including requesting the status of cells 104 in system 100. As mentioned above, in some cases the management component 119 may request a Read Status (70h) for one or more cells 104. The output of cell 104 may indicate the status of the cell. However if one or more of the dice that make up cell 104 are not in the same state the output will result in bus contention and the output may be unreliable.

In FIG. 1, arrows 141, 142, and 143 indicate that either the entire management component 119 may reside in only one of memory device 101, memory controller 103, and processor 106, or portions of management component 119 may be scattered among at least two of memory device 101, memory controller 103, and processor 106. Management component 119 may include software program instructions, firmware, hardware, or a combination thereof. An example of firmware in management component 119 includes basic input output system (BIOS) circuitry or circuitry similar to a BIOS circuitry of an electronic system. An example of hardware in management component 119 includes circuit elements such as flip-flop circuitry, register circuitry, state machine circuitry, and other circuit elements.

Memory device 101 of FIG. 1 may include non-volatile memory device such as a flash memory device. Processor 106 may include a general-purpose processor (e.g., a processor used in a computer) or an application specific integrated circuit or ASIC (e.g., a processor used in a cellular phone or a digital camera). Memory device 101 and memory controller 103 may be formed from the same semiconductor die and enclosed in the same semiconductor package or chip. Memory device 101 and memory controller 103 may also be formed from separate semiconductor dice and enclosed in separate semiconductor packages or separate chips. In some embodiments of system 100, memory controller 103 may be omitted, and memory device 101 and processor 106 may communicate with each other via one or both of buses 105 and 107. The memory array 102 of the memory device 101 may include one or more cells 104.

Figure 2:
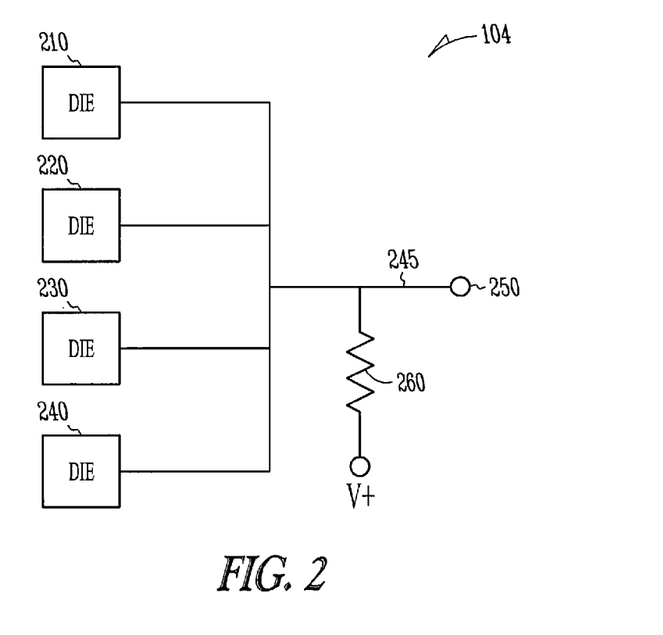
FIG. 2 shows a block diagram of a multi-die cell and a common bus according to an embodiment of the invention.

FIG. 2 shows a block diagram of a multi-die cell 104, such as a multi-die cell in a multi-lun flash memory, and a common bus 245 according to an embodiment of the invention. As noted previously, the memory array 102 in FIG. 1 may be made up of separate cells 104, where each cell may comprise one or more dice. Referring to FIG. 2, it can be seen that each of the cells 104 may comprise multiple dice 210, 220, 230, and 240, which represent four dice in a common cell 104. When a status request is received by the dice 210, 220, 230, and 240, they will provide an output on bus 245 to an output such as an input/output node 250. The output from each die may either be "high" to indicate the die is inactive or "low" to indicate the die is active. In some embodiments, other polarities or indications may be used. Input/output node 250 may provide the output on bus 245 to a variety of devices, such as a memory controller 103 or a processor 106, as shown in FIG. 1.

For ease of understanding, the reader may assume that any embodiment disclosed herein can operate within the parameters of the ONFi specification. Thus, the input/output voltage (Vccq) may be assumed to be set at 3.3 volts. Therefore, a "high" output can be indicated at a voltage of 3.3 volts and a "low" output can be indicated at a voltage of 0 volts. Other voltages and levels may also be used.

In addition to the output voltage, each die 210, 220, 230, and 240 will have drive parameter values to characterize drive strength. One such parameter value may be the output drive impedance. Another such drive parameter value may be the drive current. Generally, the stronger the drive strength, the lower the drive impedance and the higher the drive current. For FIG. 2, it can be assumed that the output drive strength, as a measured by drive impedance, of all four dice (210, 220, 230, 240) is 50 ohms. Other impedance values may also be assumed. The termination impedance 260 may also be assumed to have an impedance of 50 ohms and terminate at node V+, which is assumed to have a voltage of 1.65 volts or (Vccq)/2.

For this cell 104, a single bus 245 receives the outputs from each die 210, 220, 230, and 240, and provides the output at a common output, input/output node 250, which can serve as a status indication. The states of "active" and "inactive" may be indicated, as described above. Other states may also be indicated with respect to any device or system that makes use of a common bus 245 characterized by incidents of bus contention.

Referring now to FIGS. 1 and 2, it can be seen that upon receiving a Read Status request, for example, from management component 119, the following outputs will be received from cell 104: if die 210, 230, and 240 are inactive, their output will be "high", and if die 220 is active, the output of die 220 will be "low". Since these outputs may be received at about the same time by the memory controller 103, the Read Status inquiry may result in an output at input/output node 250 sufficiently high to be read by the system 100 as a "high" output (due to the existing bus contention). To determine the true status of each die 210, 220, 230, and 240, the system 100 may go on to send a Read Status Enhanced command for each of the dice. If this extra activity is not accomplished, data cached in die 220 may be lost when a new command is sent to the system 100.

Figure 3:
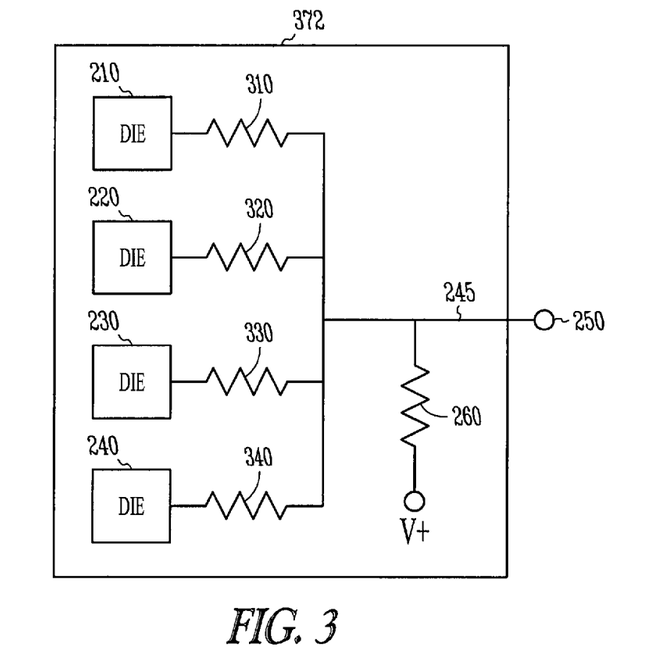
FIG. 3 shows a block diagram of a multi-die cell housed in a package, indicating the drive impedance of each die and a common bus according to an embodiment of the invention.

FIG. 3 shows a block diagram of a multi-die cell 104 of FIG. 1 housed in a package 372, indicating the drive impedance of each die 210, 220, 230, 240 and a common bus 245 according to an embodiment of the invention. To further clarify the issue of bus contention on the device, FIG. 3 illustrates the representative drive impedances 310, 320, 330, 340 corresponding to each of the dice 210, 220, 230, 240, respectively. Each die 210, 220, 230, and 240 provides an output to common bus 245. For the purposes of discussion, and not limitation, the dice 210, 230 and 240 will be assumed to be inactive, with their outputs in a "high" state (e.g., at 3.3 volts). Die 220 is assumed to be active, with a "low" output state (e.g., an output at die 220 of 0 volts). Impedances 310, 330 and 340 thus have a common termination at bus 245 and a common voltage of 3.3 volts at the dice 210, 230, and 240. The impedances 310, 330 and 340 may be treated as being in parallel. Thus if the common drive impedance of 50 ohms is assumed for each of the impedances 310, 330, and 340, their effective drive impedance will be about 17 ohms. It is further assumed that impedance 320 has a resistance of 50 ohms, as does impedance 260. Node V+ therefore has a voltage of about 1.7 volts.

Figure 4:
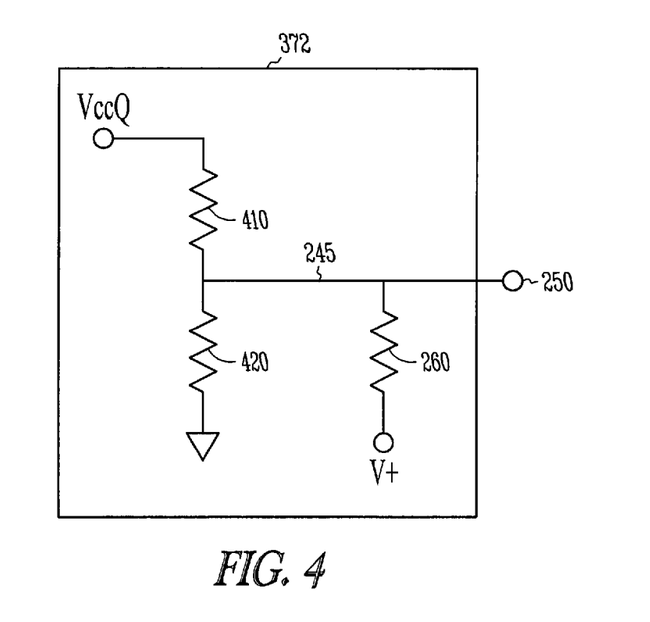
FIG. 4 shows a schematic diagram of the outputs for a multi-die package according to an embodiment of the invention.

FIG. 4 shows a schematic diagram of the outputs for a multi-die package 372 according to an embodiment of the invention. This simplified representation of an embodiment of the invention comprises a multi-die package 372 with the three dice (210, 230 and 240) in an inactive state, and one die (220) in an active state, as described with respect to FIG. 2 and FIG. 3.

Turning now to FIGS. 3 and 4, to consider the operation of the dice 210, 220, 230, 240, a supply voltage node (VccQ) of about 3.3v and a node V+ voltage of about 1.65v (VccQ/2) will be assumed. Impedance 410 represents the drive impedance of dice 210, 230, and 240, or impedances 310, 330, and 340 in parallel. Impedance 420 represents the drive impedance of die 220. Impedance 260 is the termination resistor into node V+. The output of the package 372 is at input/output node 250, and provided by bus 245.

If it is assumed that each of the impedances 310, 320, 330, 340 in the cell 104 (FIG. 1) have a drive impedance of about 50 ohms, then impedance 410 will have a drive impedance of about 16.7 ohms and impedances 420 and 260 will have an impedance of about 50 ohms each. If common industry standards for indicating high outputs and low outputs are assumed, a threshold for Voh/Vol at 0.85 volts may be used to sense a "high" output voltage at input/output node 250 when the output voltage is above 0.85 volts. An output voltage at input/output node 250 below 0.85 volts is then deemed a "low" output. The output voltage at input/output node 250 may be calculated by determining the current flows across each of the impedances. Based on the assumptions above, the voltage at input/out node 250 will be about 2.2 volts, indicating that that the dice 210, 220, 230, 240 are inactive (e.g. not busy).

In many embodiments, the impedances 310, 3200, 330, 340 can be adjusted to allow the input/output node 250 to receive an output indicating if a specific state of any of the dice 210, 220, 230, 240 exists. For instance, in the illustrated example, when one or more dice are active the input/output node 250 will have a voltage present of less than 0.85 volts. Even when only a single die is active (e.g., die 220), the input/output node 250 should indicate an active status for the cell 104, even if all other dice in the cell are inactive (e.g., dice 210, 230, 240). This result may avoid the potential loss of data, or the need to provide a Read Status Enhanced command once an inactive output has been received from the Read Status command.

Figure 5:
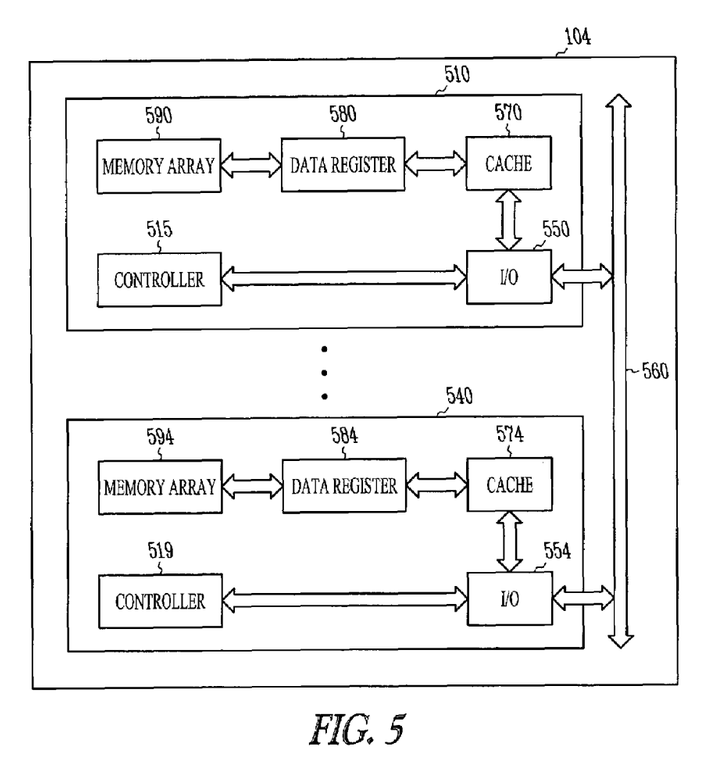
FIG. 5 shows a block diagram of individual dice in a multi-die package according to an embodiment of the invention.

FIG. 5 shows a block of individual dice 510, ..., 540 in a multi-die package such as multi-die package 372 of FIG. 3 according to an embodiment of the invention. Each of the dice 510, ..., 540 (corresponding to similar or equivalent dice 210, 220, 230, 240 in FIG. 3) may comprise common components. Die 510 comprises a single die in cell 104. Die 510 may include a controller 515 and an input/output drive 550 which provides inputs and outputs to bus 560. Input/output drive 550 may provide data to or receive data from cache 570, which can be used to store data from input/output drive 550 until it may be transferred to data register 580. Data register 580 may be used to write data to memory array 590. Memory array 590 may also provide data to data register 580, which may in turn provide data to cache 570. Cache 570 may then provide this data to input/output drive 550 for dissemination onto bus 560. In addition, controller 515 may operate to control the drive parameters of input/output drive 550 and provide the status of the die 510 to input/output drive 550 for dissemination on bus 560.

Figure 6:
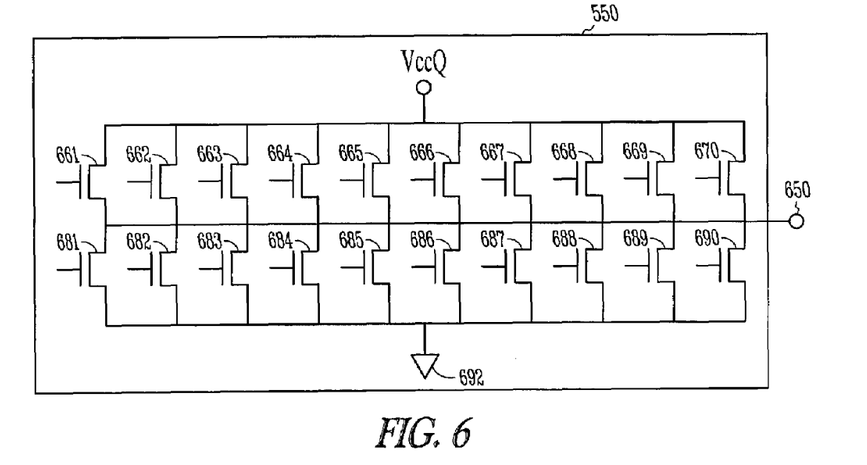
FIG. 6 is a schematic diagram of the output drive for a single die according to an embodiment of the invention.

FIG. 6 is a schematic diagram of the output drive for a single die according to an embodiment of the invention. Referring now to FIGS. 5 and 6, it can be seen that input/output drive 550 of die 510 comprises a series of pull-up and pull-down transistors 661-670 and 681-690, respectively. Pull-up transistors 661-670 are arranged in parallel between supply voltage VccQ and output node 650. Pull-Down transistors 681-690 are arranged in parallel between output node 650 and a ground node 692. Typically pull up transistors are P-channel mosfet transistors and pull down are N-channel mosfet transistors. Output drives for flash memory, perhaps forming a portion of the memory array 590, may include a similar series of transistors 661-670 to either pull the output node 650 up to a "high" output or a second series of transistors 681-690 to pull the output node 650 "low". The input/output drive 550 provides an output to node 650 that is similar to or identical to the input/output drive 550 for the die 510 of FIG. 5. The output node 650 of the input/output drive 550 could be coupled to the bus 560.

Die 540 is representative of an additional die in cell 104. Similar to die 510, die 540 comprises a memory array 594, data register 584, cache 574, controller 519, and input/output drive 554.

Setting the drive strength of input/output drive 550 can be done by enabling or disabling additional pull-up transistors 661-670 or pull-down transistors 681-690. If more transistors are enabled the overall impedance of the input/output drive is lower and the output drive strength is higher. If transistors are disabled the overall impedance of the input/output drive 550 increases and the output drive strength is lower. It should be clear that the number of transistors illustrated is merely by way of example and may not be indicative of the actual number of transistors in any particular die.

Controller 515 can operate to determine how many pull-up or pull-down transistors 661-670 and 681-690 in input/output drive 550 to enable to set the drive impedance. For example, if an input/output drive 550 has transistors 661 through 663 enabled for pull-up (e.g., to indicate a high output), the drive impedance in this mode may be approximately 50 ohms. To increase the drive level (e.g., lower the drive impedance) additional transistors 664 through 670 may be enabled until the desired drive impedance is obtained. To increase the drive impedance, or lower the drive level, transistors, for example, transistor 663 may be disabled. The number of transistors enabled or disabled may be determined during the design of the die 510, 540 and could depend upon the specific characteristics of the cell 104 and bus 560 with which the dice are coupled. For operation of input/output drive 550 at least one transistor should be enabled. By disabling all of the transistors, input/output drive 550 would appear as an open circuit. It may be desired to have input/output drive 550 appear as an open circuit if it is known that at least one die 210, 220, 230, or 240 is in the first activity state. If all dice 210, 220, 230, and 240 are in the second activity state at least one pull-up transistor 661-670, should be enabled for input.

In a similar manner, to increase the drive level or decrease the drive impedance (e.g., to indicate a low output state), the controller 515 can operate to enable additional transistors 681-690. For example, if transistors 681 through 683 were enabled to provide a standard output drive impedance of about 50 ohms, additional transistors 684-690 might be enabled to decrease the impedance until the desired output drive level was obtained.

The input/output drive 550 may be implemented as part of any one or more of the impedances 310, 320, 330, 340, 410, and 420 (see FIGS. 2, 3, and 4). Referring now to FIG. 4, it can be seen that to provide a low output (e.g., zero) below an assumed voltage threshold of 0.85 volts, the drive impedance of die 220 or impedance 420, when indicating an active status, may be reduced, or the drive impedance of dice 210, 230, and 240 or impedance 410, when indicating an inactive status, may be increased. Alternatively, the drive impedance 420 of die 220 could be decreased when indicating an active status. In addition the drive impedance 410 of dice 210, 230 and 240 could be increased when indicating an inactive status. As a result the output indication on bus 245 to input/output node 250 may be sufficiently "low" to indicate the cell 104 or die-package is active (e.g. busy), without the need to execute additional Read Status Enhanced commands.

For example, if the drive impedance 420 was decreased below about 5.2 ohms, impedance 420 remained at about 16.7 ohms and impedance 260 remained at 50 ohms, then the output voltage at input/output node 250 would be less than approximately 0.85 volts. If the threshold voltage to indicate an active device (Vol) was 0.85 volts, the system 100 (FIG. 1) would now interpret the result of the Read Status command as indicating that the cell 104 was active and therefore not available.

An alternative would be to increase the drive impedance of each of the dice that makes up impedance 410 to, for example, 75 ohms. This would render an effective drive impedance 410 of 25 ohms. The net result is that the drive strength of die 220 would only need to be increased to provide for an effective drive impedance 420 of 7.45 ohms.

Referring to FIG. 5, controller 515 may send a control signal to input/output drive 550 to either increase or decrease the drive strength of input/output drive 550 based on the output being provided to bus 560. Controller 515 may include software program instructions, firmware, hardware or a combination thereof to accomplish this activity. As an example, firmware in the controller 515 maybe pre-programmed, such that when specific requests for status or data are made by the system 100 (FIG. 1), controller 515 may send a command to input/output drive 550 to either enable or disable pull-up or pull-down transistors. In this way, normal drive strength operation of input/output drive 550 may be obtained, or may be changed when stronger or weaker drive strengths are desired.

Figure 7:
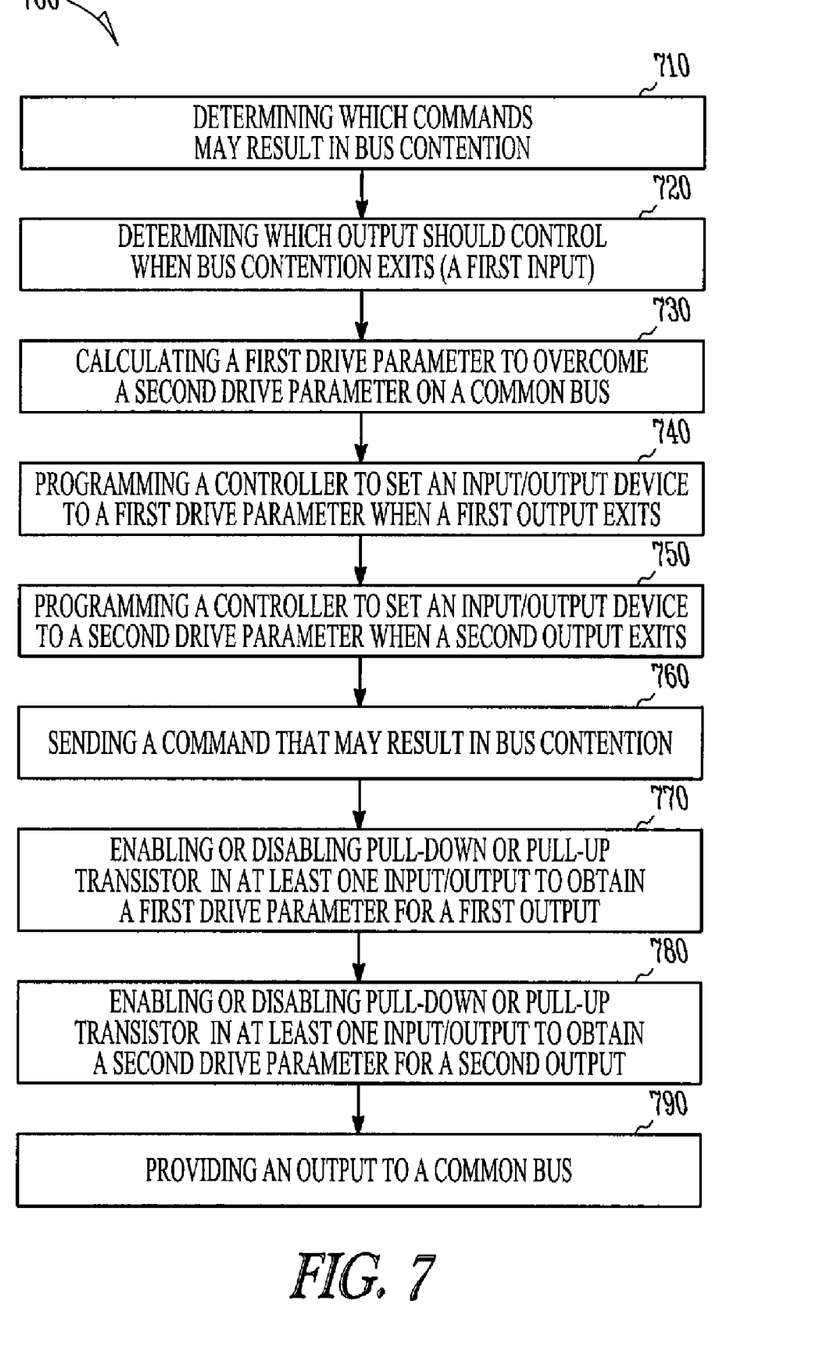
FIG. 7 shows a flow diagram of a method of setting multi-die package drive parameters according to an embodiment of the invention.

FIG. 7 shows a flow diagram of a method 700 of setting multi-die package drive parameters according to an embodiment of the invention. Method 700 may be used in system 100 (FIG. 1), and in dice 510 through 540 to operate input/output drive 550 (FIGS. 5 and 6).

Activity 710 may include determining which commands or instructions from a system may result in bus contention. As stated earlier, bus contention may occur when input/outputs such as input/output drive 550 share a common bus such as bus 560 of FIG. 5.

Activity 720 may involve determining whether a first output for a first activity state should control the output on the bus. For example in the embodiment of FIG. 2, die 220 provided an active output or "low" output to bus 245. In this example the first activity state in this case may be active. If it is determined that the output at input/output node 250 should indicate the cell 104 is active, activity 720 may result in determining, if bus contention could exist, that a first output should control. For example, in one embodiment activity 720 may determine that if a Read Status command is received, that the output of active, a first output, should control the output at input/output node 250 of FIG. 2, FIG. 3, and FIG. 4. All other outputs would not control and could be characterized as a second output for a second activity state. For example an output of inactive would be a second output for an inactive die, the second activity state. In many cases the first activity state and the second activity state may be logical opposites.

Activity 730 may involve calculating drive parameters so that a first drive parameter may overcome a second drive parameter. For the previous embodiment, activity 730 could operate to determine the drive parameters of the input/outputs of the dice in cell 104 such that if a first output was provided by any of the die in cell 104, the first output would be sent by cell 104. Activity 730 may involve calculating the drive impedance used so that the output of the drive for a first output controls the ultimate output at input/output node 250 of the embodiment of FIG. 2. As shown in FIG. 3 and 4, activity 730 calculates a drive impedance of 5.2 ohms for impedance 420 when indicating die 220 was active and the drive impedance for dice 210, 230 and 240 are 50 ohms each while dice 210, 230 and 240 are inactive.

Activity 740 may operate to program commands in the basic input/output (BIOS) or other firmware of management component 119 of the embodiment of FIG. 1 or in controller 515 of the embodiment of FIG. 5. The firmware of either of these embodiments can be programmed so that if a command that may result in bus contention (e.g., as determined in activity 710) is given, and a first output is intended for presentation at an input/output drive 550, a first set of drive parameters will be set at input/output drive 550, as described in FIG. 6, by enabling additional pull-down transistors 681-690.

Similarly, activity 750 may operate to program commands in the firmware of management component 119 of the embodiment of FIG. 1 or in controller 519 of the embodiment of FIG. 5. The firmware of either of these embodiments could be programmed so that if a command that may result in bus contention (e.g., as determined in activity 710) is given, and a second output is intended for presentation at an input/output drive 554, a second set of drive parameters will be set at input/output 550. For this example the second state may be to indicate that dice 210, 230, or 240 are inactive. To set the input/output as described in FIG. 6, the second set of drive parameters may be set by disabling one or more transistors 661-670.

Activity 760 may include sending commands that may result in bus contention (e.g., as determined in activity 710) to one or more of cells 104 of system 100 of the embodiment of FIG. 1 or to the dice 210, 220, 230, 240 of the embodiment of FIG. 2 or dice 510 through 540 of the embodiment of FIG. 5.

Activity 770 may include performing the actions of having controller 515 of the embodiment of FIG. 5 operate to adjust input/output drive 550 to enable additional pull-down transistors, enable additional pull-up transistors, disable additional pull-down transistors, or disable additional pull-down transistors. For the instance described in the embodiment of FIG. 2, FIG. 3 and FIG. 4, input/output drive 550 might be adjusted (e.g., via commands or output signals from the controller 515) to enable additional pull-down transistors until the drive impedance of input/output drive 550 had a drive impedance of less than about 5.2 ohms.

Activity 780 may in include performing the actions of having controller 519 of the embodiment of FIG. 5 operate to adjust input/output drive 554 to enable additional pull-down transistors, enable additional pull-up transistors, disable additional pull-down transistors or disable additional pull-down transistors. For the instance described in the embodiment of FIG. 2, FIG. 3 and FIG. 4, input/output drive 554 might be adjusted (e.g., via commands or output signals from the controller 519) to disable additional pull-up transistors. Perhaps, according to the second example of FIG. 4, operating to disable pull-up transistors (661-670) until the drive impedance of input/output drive 554 presented a drive impedance of greater than about 75 ohms. In the case of the first example of FIG. 2, FIG. 3 and FIG. 5, the drive impedance may be set by the controller 519 at approximately 50 ohms (e.g., according to activity 730).

Activity 790 may include providing the outputs from each die to indicate the first and second outputs, such that the first output would control all other outputs (e.g., the second output) at input/output node 250 of the embodiment of FIG. 2. For example, dice 210, 230 and 240 in a second state, inactive, may provide "high" outputs, a second output, to bus 245. Die 220 in a first activity state, active, may provide a "low" output, a first output, to bus 245.

In the embodiment of the invention described above the drive was increased for a specific die for a specific state. It should be noted that the drive parameters may be increased or decreased as needed to reduce bus contention such as to provide for greater certainty for the outputs of multi-die cell. For example, it may be desired to have all of the dice at a first drive level when indicating an inactive state of a first impedance, and at a second drive level to indicate an active state of a second impedance. By setting the drive impedances with the input/output drive 550 for dice 210, 220, 230, and 240 as discussed in FIG. 7, it may be possible to control which outputs for the dice 210, 220, 230, 240 will control the output at input/output node 250. Therefore, it may be possible for those skilled in the art to determine which commands, such as a Read Status command, may cause bus contention. By knowing these commands, those skilled in the art may determine that they are looking for a specific response, such as an active or inactive output, to control the input/output node 250.

For example, by using the apparatus, systems, and methods described herein, if it was desired to know whether any die in a selected package was inactive when a Read Status command is given, one of ordinary skill in the fabrication of memory circuits could design the die to have a first drive parameter when indicating an active state of a first impedance, and a second drive parameter when indicating an inactive state of a second impedance. One of ordinary skill in the art could set controllers 515 and 519 to enable additional pull-up transistors 661-670 and disable pull-down transistors 681-690 when a Read Status command is received. The drive strength would be higher and the drive impedance lower when indicating an inactive state, and the output at input/output node 250 may indicate an inactive state for multi-die cell 104.

Implementing the apparatus, systems, and methods described herein may provide the ability to control the outputs at input/output node 250 when bus contention may exist, allowing one of ordinary skill in the art to determine what outputs from die 210, 220, 230, 240 would control the output at input/output node 250. Another advantage of the apparatus, systems and methods described herein may be the ability to manage the drive strength of input/output drive 550 when specific commands are received to have stronger or weaker drive impedances while maintaining normal operation for other commands.

Figure 8:
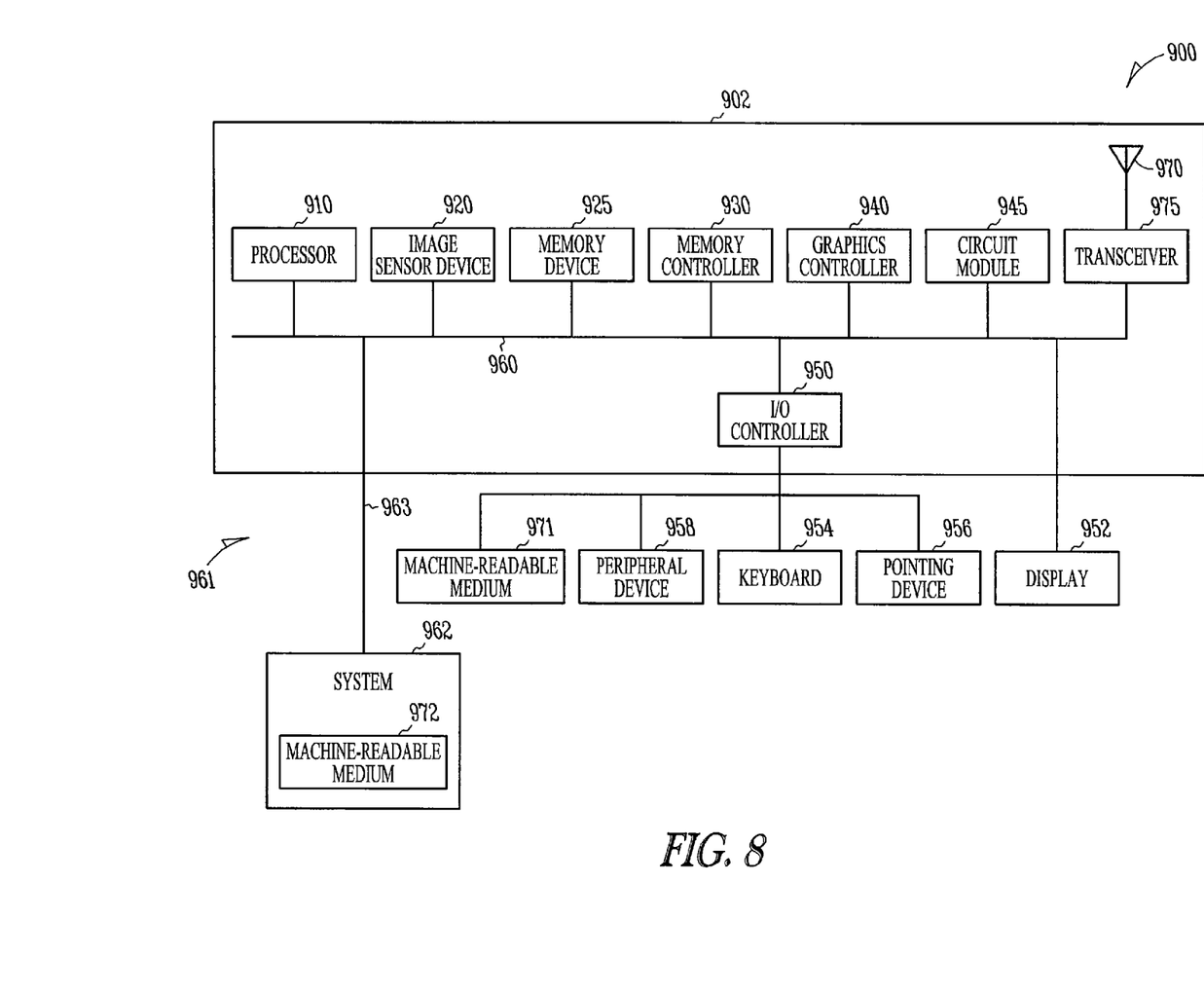
FIG. 8 shows a block diagram of a system according to an embodiment of the invention.

FIG. 8 shows a network 900 according to an embodiment of the invention. Network 900 may include systems 961 and 962 communicating with each other via a connection 963. Connection 963 may include a wired or wireless connection. In some embodiments, connection 963 may include an internet connection.

System 961 may include a processor 910, an image sensor device 920, a memory device 925, a memory controller 930, a graphics controller 940, a circuit module 945, an I/O controller 950, a display 952, a keyboard 954, a pointing device 956, a peripheral device 958, and a bus 960 to transfer information among the components of system 961. System 961 may also include an antenna 970 to transmit and receive information wirelessly. The antenna 970 may be coupled via a transceiver 975 to the bus 960.

System 961 may also include a circuit board 902 on which some components of system 961 may be located. In some embodiments, the number of components of system 961 may vary. For example, in some embodiments, system 961 may omit one or more of display 952, image sensor device 920, memory device 925, and circuit module 945. System 961 may include an embodiment of system 100 of FIG. 1.

Processor 910 may include a general-purpose processor, e.g., a processor used in a computer. Processor 910 may include an application specific integrated circuit (ASIC), e.g., a processor used in a cellular phone, or a digital camera or camcorder. Processor 910 may comprise a single core processor or a multiple-core processor. Processor 910 may execute one or more programming commands to process information to produce processed information. The information may include digital output information provided by other components of system 961, such as image sensor device 920 or memory device 925.

Image sensor device 920 may include a complementary metal-oxide-semiconductor (CMOS) image sensor having a CMOS pixel array or a charge-coupled device (CCD) image sensor having a CCD pixel array.

Memory device 925 may include a volatile memory device, a non-volatile memory device, or a combination of both. For example, memory device 925 may comprise a dynamic random access memory (DRAM) device, a static random access memory (SRAM) device, a flash memory device such as NAND or NOR flash memory device, or a combination of DRAM, SRAM, and flash memory devices. In some embodiments, memory device 925 may include one or more embodiments of memory devices 101, and cells 104 and multi-die package 372, described above with reference to FIG. 1 through FIG. 7.

Display 952 may include an analog display or a digital display. Display 952 may include a liquid crystal display (LCD) or a plasma display. Display 952 may receive information from other components. For example, display 952 may receive information that is processed by one or more of image sensor device 920, memory device 925, graphics controller 940, and processor 910 to display information including text and images.

Circuit module 945 may include a circuit module of a vehicle. Circuit module 945 may receive information from other components to activate one or more subsystems of the vehicle. For example, circuit module 945 may receive information that is processed by one or more of image sensor device 920, memory device 925, and processor 910, to activate one or more of an air bag system of a vehicle, a vehicle security alarm, and an obstacle alert system in a vehicle.

As shown in FIG. 8, system 961 may include a machine-readable medium 971. System 962 may include a machine-readable medium 972. Each of machine-readable media 971 and 972 may include a memory, e.g., removable storage media, and any memory including an electrical, optical, or electromagnetic conductor.

The Abstract of the Disclosure is provided to comply with 37 C.F.R. §1.72(b) requiring an abstract that will allow the reader to quickly ascertain the nature of the technical disclosure. It is submitted with the understanding that it will not be used to interpret or limit the scope or meaning of the claims. The above description and figures illustrate embodiments of the invention to enable those skilled in the art to practice the embodiments of the invention. While the illustrations used were indicative of a multi-lun device indicating the active status of a die, the intention of the inventor is that the description above could easily be adapted for use in any situation where bus contention may arise. Thus the following claims are hereby incorporated into the Detailed Description, with each claim standing on its own as a separate embodiment.

What is claimed is:

1. An apparatus comprising:

a plurality of dice; and a common output coupled to at least two of the dice included in the plurality of dice, wherein at least one of the dice coupled to the common output has a first drive parameter value in a first state and a second drive parameter value in a second state, and wherein the plurality of dice are configured to receive a status request from a management component and to provide a first status corresponding to the first state on the common output in response to the status request if at least one of the dice coupled to the common output has the first status, and the plurality of dice are configured to provide a second status corresponding to the second state on the common output in response to the status request if none of the dice coupled to the common output have the first status.

2. The apparatus of claim 1, wherein at least one of the dice comprises:

an output drive comprising a plurality of pull-up transistors arranged in parallel between a supply voltage node and an output node.

3. The apparatus of claim 1, wherein at least one of the dice comprises:

an output drive comprising a plurality of pull-down transistors arranged in parallel between a ground node and an output node.

4. The apparatus of claim 2, wherein said output drive comprises:

a plurality of pull-down transistors arranged in parallel between a ground node and the output node, wherein the output drive can be used to indicate one of the first and the second state.

5. The apparatus of claim 1, further comprising a controller configured to set the first and the second drive parameter values.

6. The apparatus of claim 1, wherein the first state is active, and the second state is inactive.

7. The apparatus of claim 1, wherein the first state comprises a logical opposite of the second state.

8. The apparatus of claim 1, wherein at least one the first and second drive parameters comprises one of an output impedance and a drive current.

9. The apparatus of claim 5, wherein said first drive parameter value is set by enabling at least one pull-down transistor.

10. The apparatus of claim 5, wherein said second drive parameter value is set by disabling at least one pull-up transistor.

11. The apparatus of claim 9, wherein said second drive parameter value is set by disabling at least one pull-up transistor.

12. The apparatus of claim 5, wherein said first drive parameter value is set by enabling at least one pull-up transistor.

13. The apparatus of claim 12, wherein said second drive parameter value is set by disabling at least one pull-down transistor.

14. The apparatus of claim 1, wherein at least one said first and second drive parameters comprises drive strength.

15. An apparatus comprising:
a plurality of dice;
a common output coupled to at least two of the dice included in the plurality of dice, wherein at least one of the dice coupled to the common output has a first drive parameter value in a first state and a second drive parameter value in a second state, and wherein the common output can be used to indicate that all of the dice coupled to the common output are in the first state if at least one of the dice coupled to the common output are in the first state; and
a controller configured to enable at least one pull-up transistor to set the first drive parameter value and to disable at least one pull-down transistor to set said second drive parameter value, wherein the first drive parameter value comprises an impedance of about 5 ohms.

16. The apparatus of claim 1, wherein the status request includes a request whether at least one of the dice has the first status or the second status, the first and second status include opposite status between an active state status of at least one of the dice and an inactive state status of at least one of the dice.

17. The apparatus of claim 16, wherein the plurality of dice have normal drive parameters when a status request is not sent.

18. A method comprising:
receiving from a management component a status request that requests whether a die in a multi-die package is in a first state or a second state, the first and second states corresponding to opposite states between an active state of the die and an inactive state of said die;
driving a common output with an output drive of said die in the multi-die package in response to the status request to obtain a first drive parameter value when said die is in the first state; and
adjusting an output drive of said die in the multi-die package to obtain a second drive parameter value to drive said common output when said die is in the second state, wherein said common output is driven in response to the status request to indicate the first state whenever at least one die in the multi-die package is in the first state, and wherein said common output is driven in response to the status request to indicate the second state whenever no dice in the multi-die package are in the first state.

19. The method of claim 18, comprising:
enabling pull-down transistors for one or more dice in the multi-die package to obtain said first drive parameter value.

20. The method of claim 18, comprising:
disabling pull-up transistors for one or more dice in the multi-die package to obtain the second drive parameter value.

21. The method of claim 19, comprising:
disabling pull-up transistors for one or more dice in the multi-die package to obtain the second drive parameter value when dice are in the second state.

22. The method of claim 21, comprising:
determining that a command received by the multi-die package may result in bus contention.

23. The method of claim 22, comprising:
determining the first state responsive to receiving the command.

24. The method of claim 23, comprising:
determining said first drive parameter value and said second drive parameter value according to the first state.

25. The method of claim 22, comprising:
sending first instructions from a controller to set said first drive parameter value responsive to receiving said command.

26. The method of claim 22, comprising:
enabling pull-down transistors for one or more dice in the multi-die package to obtain said first drive parameter value responsive to receiving said command.

27. The method of claim 25, comprising:
sending second instructions from the controller to set said second drive parameter value responsive to receiving said command.

28. A method comprising:
receiving from a management component a status request that requests whether a die in a multi-die package is in a first state or a second state, the first and second states corresponding to opposite states between an active state of the die and an inactive state of said die;
enabling at least one pull-up transistor associated with said die in the multi-die package having a common output in response to a status request to obtain a first drive parameter value when said die is in a first state; and
enabling at least one pull-down transistor associated with said die in the multi-die package in response to the status request to obtain a second drive parameter value when said die is in a second state, wherein said common output is driven in response to the status request to indicate the first state whenever at least one die in the multi-die package is in the first state, and wherein said common output is driven in response to the status request to indicate the second state whenever no dice in the multi-die package are in the first state.

29. The method of claim 28, comprising:
enabling at least one pull-up transistors associated with the die depending on a size of the second die.

30. A system comprising:
a device comprising a plurality of dice and a common output coupled to at least two dice included in the plurality of dice, wherein each of the dice coupled to the common output have a first drive parameter value in a first state and a second drive parameter value in a second state, and wherein the common output can be used to indicate that all of the dice coupled to the common output are in the first state if at least one of the dice coupled to the common output are in the first state;

a processor to process information stored in the device; and a management component to submit a status request to the plurality of dice.

31. The system of claim 30, wherein the management component is coupled to the common output and receives an output from the common output.

32. The system of claim 30, wherein at least one of the plurality of dice comprise:

a set of pull-up transistors coupled to the common output;

a set of pull-down transistors coupled to the common output; and a controller coupled to the set of pull-up transistors and the set of pull-down transistors, wherein the controller is configured to selectively enable the pull-up and pull-down transistors to provide an indication of either the first or the second states.

33. A method comprising:

receiving from a management component a status request that requests whether a die in a multi-die package is in a first state or a second state, the first and second states corresponding to opposite states between an active state of the die and an inactive state of said die;

driving a common output with an output drive of a die in the multi-die package in response to the status request to obtain a first drive parameter value when said die is in a first state; and an output drive of said die in the multi-die package having a second drive parameter value to drive the common output in response to the status request when said die is in a second state different from the first state, wherein said common output is driven in response to the status request to indicate the first state whenever at least one die in the multi-die package is in the first state, and wherein said common output is driven in response to the status request to indicate the second state whenever no dice in the multi-die package are in the first state.

34. The method of claim 33, comprising:

enabling pull-down transistors for one or more dice in the multi-die package to obtain said first drive parameter value.

35. The method of claim 33, comprising:

enabling pull-up transistors for one or more dice in the multi-die package to obtain said first drive parameter value.

* * * * *

UNITED STATES PATENT AND TRADEMARK OFFICE
CERTIFICATE OF CORRECTION

PATENT NO.        : 7,558,130 B2                                           Page 1 of 1
APPLICATION NO.   : 11/757834
DATED             : July 7, 2009
INVENTOR(S)       : Terry M. Grunzke

It is certified that error appears in the above-identified patent and that said Letters Patent is hereby corrected as shown below:

In column 11, line 3, in Claim 8, after "one" insert -- of --.

In column 11, line 21, in Claim 14, after "one" insert -- of --.

Signed and Sealed this

Twenty-fifth Day of August, 2009

David J. Kappos
*Director of the United States Patent and Trademark Office*